United States Patent [19]

Peterson et al.

[11] 4,042,878
[45] Aug. 16, 1977

[54] MULTI-CONDUCTOR CABLE TESTING SYSTEM WITH TRACK-MOUNTED SOCKETS FOR ACCOMMODATING THE CABLE CONNECTORS

[75] Inventors: Roger W. Peterson; Arthur W. Kordes, both of Los Altos, Calif.

[73] Assignee: Fasttest Company, Mountain View, Calif.

[21] Appl. No.: 732,583

[22] Filed: Oct. 15, 1976

[51] Int. Cl.² .......................................... G01R 31/02
[52] U.S. Cl. ................................. 324/51; 324/158 F
[58] Field of Search ............... 324/51, 52, 66, 73 AT, 324/73 R, 158 F; 339/18 R, 18 B, 176 MF

[56] References Cited

U.S. PATENT DOCUMENTS

| | | | |
|---|---|---|---|
| 2,849,677 | 8/1958 | Hannon | 324/73 R |
| 2,892,153 | 6/1959 | Neill | 324/73 R |
| 2,953,744 | 9/1960 | Miller et al. | 324/66 |
| 3,197,695 | 7/1965 | Wingfield | 324/73 R X |
| 3,528,104 | 9/1970 | Ehlschlager | 324/51 |
| 3,549,995 | 12/1970 | Trousdale et al. | 324/73 |
| 3,728,616 | 4/1973 | Cheek et al. | 324/66 |
| 3,740,644 | 6/1973 | Schag et al. | 324/66 |

Primary Examiner—Gerard R. Strecker
Attorney, Agent, or Firm—Thomas Schneck, Jr.

[57] ABSTRACT

A cable testing apparatus for multi-conductor cables including a test fixture for mechanically securing the cable to be tested. A plurality of tracks within the test fixture accommodates connectors of selected width. A control box which has a test lamp for each conductor energizes both the lamps and the conductors through a jumper cable for providing a continuity check through the tested conductors.

11 Claims, 6 Drawing Figures

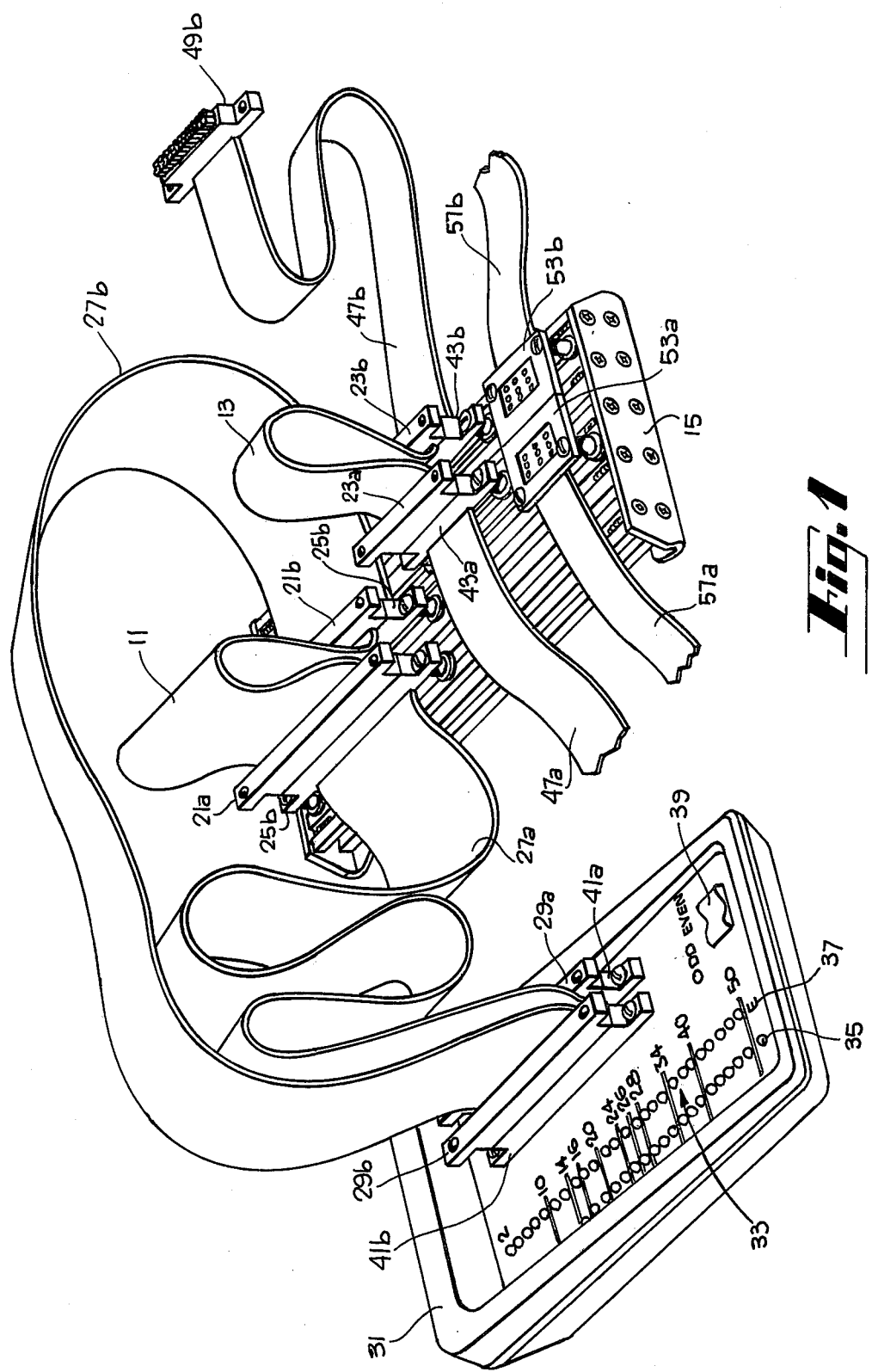

MULTI-CONDUCTOR CABLE TESTING SYSTEM WITH TRACK-MOUNTED SOCKETS FOR ACCOMMODATING THE CABLE CONNECTORS

BACKGROUND OF THE INVENTION

1. Field of the Invention.

The invention relates to test apparatus for multi-conductor electrical cables, specifically to a stable test fixture for easily securing a cable to be tested.

2. Prior Art.

The testing of multi-conductor electrical cable by means of continuity checks through various electrical circuits is known. For example, U.S. patent application B534,767, published Feb. 3, 1976, shows a circuit for selectively testing each of a plurality of conductors within a multi-conductor cable. While this system may prove satisfactory for testing individual conductors, it is frequently desirable to test an entire cable simultaneously and to have a secure mechanical fixture for holding the cable while it is tested. This is especially true in manufacturing or assembly operations where time is of the essence. While various test fixtures for integrated sockets and printed circuit boards have been devised, such as those exemplified in U.S. Pat. Nos. 3,931,574 and 3,906,373, respectively, there is no known test system for rapidly securing and testing flat multi-conductor electrical cables.

Accordingly, it is an object of the present invention to devise a test system for securing and almost simultaneously testing all leads within such a cable.

SUMMARY OF THE INVENTION

The above object is achieved with a cable testing system for testing multi-conductor electrical cables of selected width by using a novel test fixture which has provisions for holding cable connectors of selected widths and a separate control box which may be remote from the test fixture for energizing the cable to be tested. The test fixture is a mechanically stable metal or plastic fixture having a plurality of tracks for mounting cable connectors of selected widths. The test fixture includes at least a first pair of connectors for mating to a test pair of connectors of a multi-conductor cable under test. The control box, which may be located remote to the test fixture, has a multiplicity of test lamps therein, at least one corresponding to each conductor of the multi-conductor cable and a switch for energizing the test lamps from a power supply. The test lamps are connected to the cable under test by means of an electrical jumper cable. Usually there is a conductor in the jumper corresponding to each conductor in the cable under test such that a lamp in the control box is connected through a conductor in the jumper cable to a corresponding conductor in the cable under test and then a return path through a return jumper cable completes circuits to the test lamps.

Since the test bed has a plurality of tracks for mounting cable connectors of selected width, and shape, virtually any multi-conductor electrical cable may be securely held in place and rapidly tested.

In flat cable, conductors are aligned in a parallel plane. We have found that it is desirable to test conductors in flat cable in two groups, an odd-numbered group and an even-numbered group. By energizing conductors in an odd-even sequence, there is a distinct advantage for testing for shorts. We have found that in almost all cases of shorts, an even numbered conductor is shorted to an odd-numbered conductor, or vice-versa. Since all odd and even numbered conductors are on a common bus, a short between one odd and even conductor will energize all odd and even conductors, thereby lighting all lamps. An open circuit in a single conductor will merely prevent completion of a current path through a particular conductor under test and a corresponding test lamp will not light. Since there is one test lamp for each conductor under test, an open circuit may be readily located.

BRIEF DESCRIPTION OF THE DRAWINGS

FIG. 1 is a perspective of the test apparatus of the present invention.

DESCRIPTION OF THE PREFERRED EMBODIMENT

Figure 5:
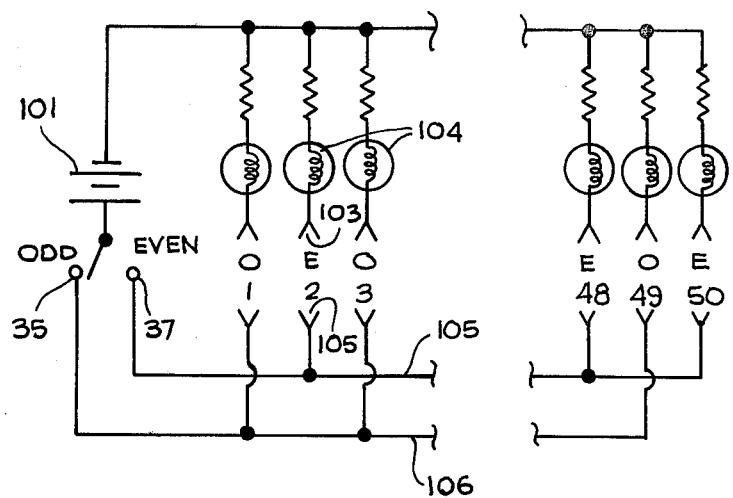
FIG. 5 is an electrical schematic of the test apparatus of the present invention.

The cable testing system of the present invention is particularly suitable for testing flat cable, some of which is known as "Scotchflex", a registered trademark of 3M Company. In such electrical cable, conductors are aligned in parallel paths along the length of the cable. The width of the cable is proportional to the number of conductors and to the size of the conductor. Generally, the ends of the cable are terminated in connectors which may or may not have parallel alignment. Frequently, the connectors have two or more rows of terminals which mate with corresponding sockets. The terms "sockets" and "connectors" are used interchangeably herein with the intent that connectors have pins, and sockets have receptacles for pins, with respective sockets and connectors capable of fitting together in a mating relationship.

With reference to FIG. 1, two cables to be tested 11, 13 are shown secured to test fixture 15. The cable 11 is a flat multi-conductor cable, consisting of perhaps fifty parallel conductors of equal length which are terminated in connectors 21a and 21b. A first pair of sockets 25a, 25b receives the connectors 21a, 21b and holds the cable to be tested, 11, in electrical contact through the aforementioned sockets. A pair of jumper cables 27a, 27b is respectively connected to the first pair of sockets 25a, 25b and terminated in connectors 29a, 29b. The jumper cables and associated connectors form a jumper means for connecting cable to tested 11 to the control box 31.

Control box 31 has a multiplicity of test lamps 33, one test lamp corresponding to each conductor in a cable to be tested. The lamps are divided into two groups, odd and even, represented by the rows of lamps 35 and 37 respectively. Control box 31 contains energy source, such as the battery and resistors connected to each lamp for adjusting the voltage through each lamp. An electrical schematic of the control box will be described below with reference to FIG. 5.

Control box 31 further includes sockets 41a, 41b for receiving connectors having terminals for the maximum number of conductors which can be accommodated by the lamps and associated circuits of the control box 31. The exemplary cable to be tested, 11, has the maximum number of conductors, 50, so that the jumper cables 27a, 27b and the associated connectors and sockets would have a corresponding number of terminals. All 50 lamps shown on the control box 31 would be used in such a situation. There is no reason to limit the number of control lamps to 50, but this is a convenient size and is illustrated in the preferred embodiment. A greater number or a lesser number could also be used.

Control box 31 also includes a switch 39 for selectively energizing odd lamps 35 or even lamps 37. Operation of the switch 39 will be explained in further detail in connection with FIG. 5.

In addition to testing cables of a maximum width, such as the cable 11, illustrated in FIG. 1, the apparatus may test narrower cable, such as cable 13 which is terminated in connectors 23a, 23b, which, in turn, are electrically connected to the receiving sockets 43a, 43b. A pair of jumper cables 47a, 47b have the same width as the cable 13 and are selectively connected to the control box 31 when cable 13 is to be tested. The terminating connectors of jumper cables 47a, 47b do not extend across the full width of the receiving sockets 41a, 41b of the control box 31, but rather are positioned near the top of control box 31 and extend toward the bottom such that the upper lamps of the control box will correspond in number to the number of conductors in the cable 13. For example, one of the connectors 49b is shown and has essentially the same shape as connector 29b, but is narrower because of the lesser number of conductors in cable 13.

The connector of the jumper cable which is received by the sockets 41a, 41b must have a shape which generally corresponds to those sockets. However, the other end of the jumper cables, that is, the end which is secured by the test fixture 15, should have sockets which correspond to the connectors in the cable under test. For example, the sockets 53a, 53b show a rectangular array of terminals in such that a socket may be securely held in test fixture 15 in the same manner as the conventional sockets 43a, 43b.

Figure 2:
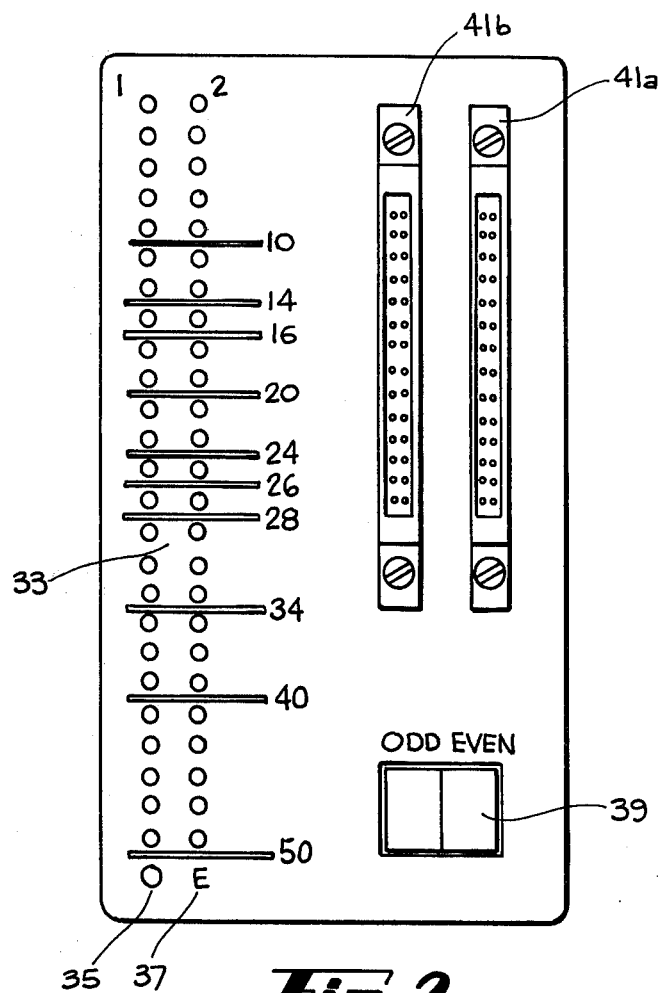
FIG. 2 is a top view of the control panel portion of the control box illustrated in FIG. 1.

FIG. 2 illustrates the control panel of control box 31. The control panel includes the lamps 33 which have been divided into two groups, the odd group 35 and the even group 37. It will be seen that the lamps 33 are aligned in two rows, numbered 1 and 2 and are vertically divided at lengths corresponding to ordinary cable widths. For example, standard flat cable widths include 10-conductor cables, 14-conductor cables, 16-conductor, 20-conductor, 24-conductor, 26-conductor, 28-conductor, 34-conductor, 40-conductor, and 50-conductor. The corresponding numbers 10, 14, 16, 20, 24, etc., serve to identify both the number of conductors of the cable under test and, in the event a lamp fails to light, the number of the particular lamp.

Sockets 41a, 41b are shown, and it should be remembered that the connector of a jumper cable is always connected at the top of sockets 41a, 41b so that lamp number 1 will be the first of the odd-numbered lamps which is illuminated and lamp number 2 will be the first of the even-numbered lamps which will be illuminated.

Figure 3:
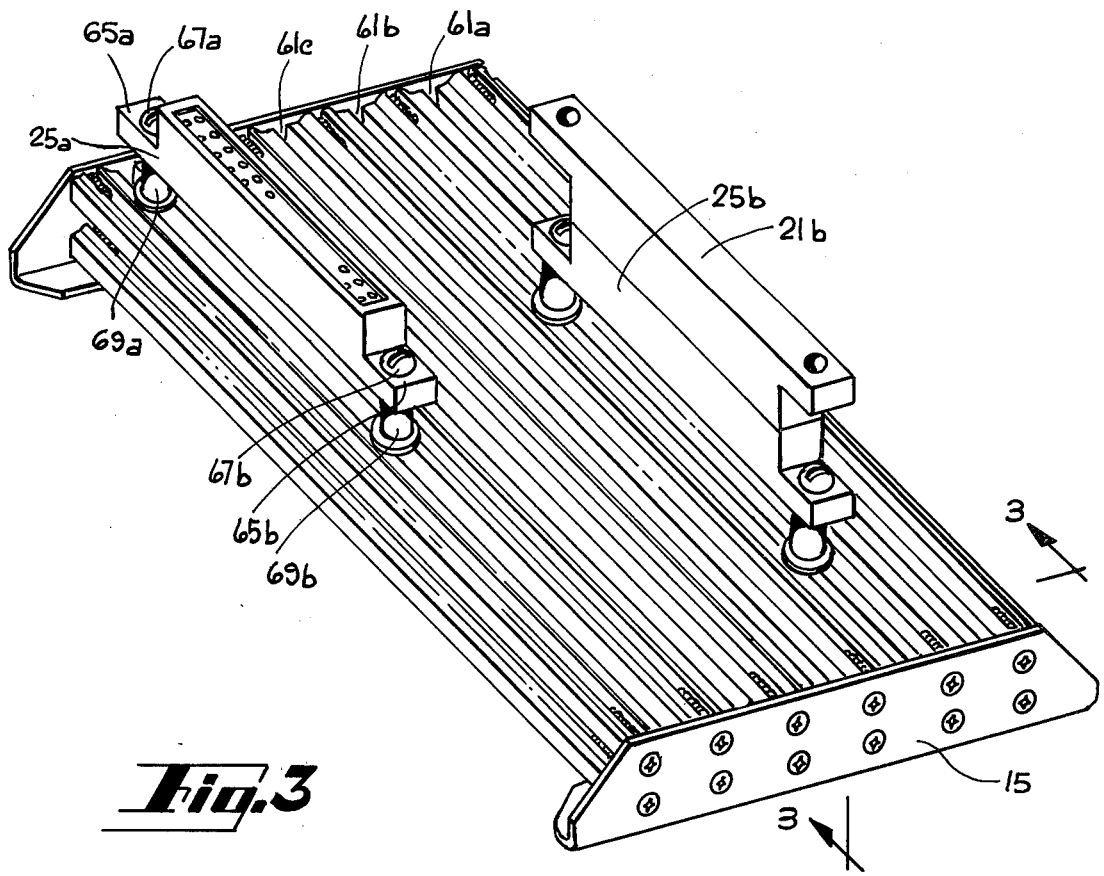
FIG. 3 shows a perspective view of the test fixture portion of the apparatus of FIG. 1.

FIG. 3 illustrates the test fixture of the present apparatus in greater detail. In FIG. 3, it is seen that the test fixture has a plurality of elongated tracks 61a, 61b, 61c, etc. The tracks extend along the length of the test fixture 15 and are parallel to each other. Sockets 25a, 25b are mounted in said tracks by means of connector mounting hardware. Typically, a connector has shoulders for mounting such hardware. For example, connector 25a has shoulders 65a, 65b through which screws 67a, 67b are mounted and stand off tubular members, which may be insulators 69a, 69b, space the socket from the test fixture to leave room for a cable to enter the underside of the socket 25a. In some instances a cable may enter a socket's side, but it is still desirable to mount the connector above the testbed to permit visual inspection of the socket. The length of a standoff is approximately ⅜ of an inch and should not be too much longer, because bending moments in the screws 67a, 67b are to be avoided. The purpose of test fixture 15 is to provide mechanical stability in securing connectors of the cable to be tested so that a quick positive connection in test may be made. This is promoted by arranging the sockets 25a, 25b in positions where rapid and positive connections to sockets 25a, 25b may be made by connectors coming in contact with them, such as the connectors 21a, 21b.

Figure 4:
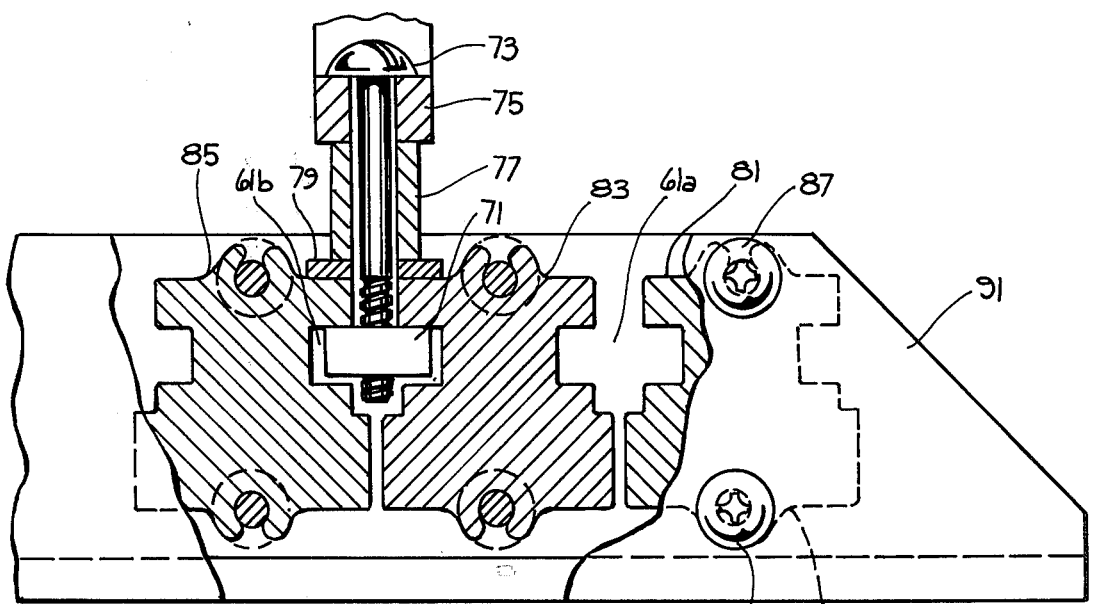
FIG. 4 is a partial sectional view of the apparatus of FIG. 2 taken along the lines 3—3 in FIG. 2.

The sockets 25a, 25b may be moved linearly along the tracks which they occupy. This may be seen in FIG. 4. Tracks 61a and 61b of FIG. 3 are illustrated in section in FIG. 4. It will be seen that the track 61a has a cross-shaped cross section, and similarly each of the other tracks has a similar cross section. The width of the section is wide enough to accommodate a nut 71 which serves to secure a screw 73 for holding a connector end 75 at a distance partially determined by spacer 77 and washer 79.

The various tracks 61a, 61b, etc., are defined within the sides of metal bars 81, 83, 85, each of which is extruded or machined to the desired shape. The extruded shape includes indentations for defining half of the cross-shaped cross section, such as 61a on one side, as well as half of another cross-shaped cross section, such as 61b on the opposite thereof. A plurality of such bars are aligned in parallel and fastened in place such as by screws 87, 89 which fit through a trapezoidal end member 91 and through screw detents 93, 95 which are extruded into each metal bar. The trapezoidal shape of the end members is selected for mechanical stability of the entire apparatus, such that bending moments will not cause tipping of the test fixture.

To move the connector to a desired location, it may be seen that by releasing the nut 71, the nut will drop slightly in the track 61b permitting motion of the connector 75 along the length of the track until screw 73 is tightened, raising nut 71 to press upwardly against the track and by means of friction, restrict the further motion of connector 75. Thus, using ordinary connector mounting hardware such as screws and nuts, an ordinary flat cable socket serves as a mounting means for receiving connectors of the cable to be tested. Furthermore, the sockets are movable to convenient positions where connectors may be readily and rapidly connected and pulled apart with a maximum of mechanical support.

FIG. 5 illustrates an electrical schematic of the energizing means of the present apparatus. A battery 101 supplies power to even or odd test terminals through switch 39. When the switch is connected to the even terminal, 37, it will be seen that even conductors are energized when a cable is connected across test terminals 103, 105. A test cable is not shown and neither is a jumper cable. In fact, the jumper cable is connected to the control box to the test fixture and then the cable under test is connected between jumper cables as previously described. However, for purposes of simplicity, the reduced electrical schematic FIG. 5 indicates that the test cable would be connected between terminals 103 and 105 and similarly, for purposes of explanation, it is assumed that cable under test is connected between all 50 test positions extending from 01,E2,03 to E48,049, and E50. Thus, when switch 39 is moved to the odd terminal 35, all odd conductors are energized, resulting in the illumination of all odd group lamps. When the switch is in the even position, all even group lamps should light. The exceptions are two. First, when there is a short circuit, the short will most likely occur between adjacent odd and even conductors. This will put power on both odd and even conductors and because of the common buses 105, 107 connecting even and odd conductors, a short will cause power to be applied to all test lamps. Thus, the illumination of all test lamps when the switch is in only one position indicates a short existing between two conductors. On the other hand, if a lamp fails to become illuminated, it indicates an open circuit in the conductor corresponding to the lamp which is out. For example, if the switch 39 is connected to the odd lamp terminal 35 and one of the odd lamps fails to light, say 049, it indicates an open circuit in the conductor corresponding to that lamp. At the same time, all other lamps corresponding to odd numbered conductors should be lit, but all lamps corresponding to even numbered conductors should be out. In a similar manner, when the switch is connected to even terminal 37, all the lamps corresponding to even numbered conductors should be lit and all odd numbered lamps should be out. Since switch 39 can be flipped between odd and even positions in a matter of a few seconds or less, a flat cable to be tested may be tested very rapidly after having been secured in position. As pointed out previously, a cable may be readily secured in position by means of adjustment of corresponding sockets in the test fixture 15 at desired positions so that the cable may be grasped with these and positively connected.

Figure 6:
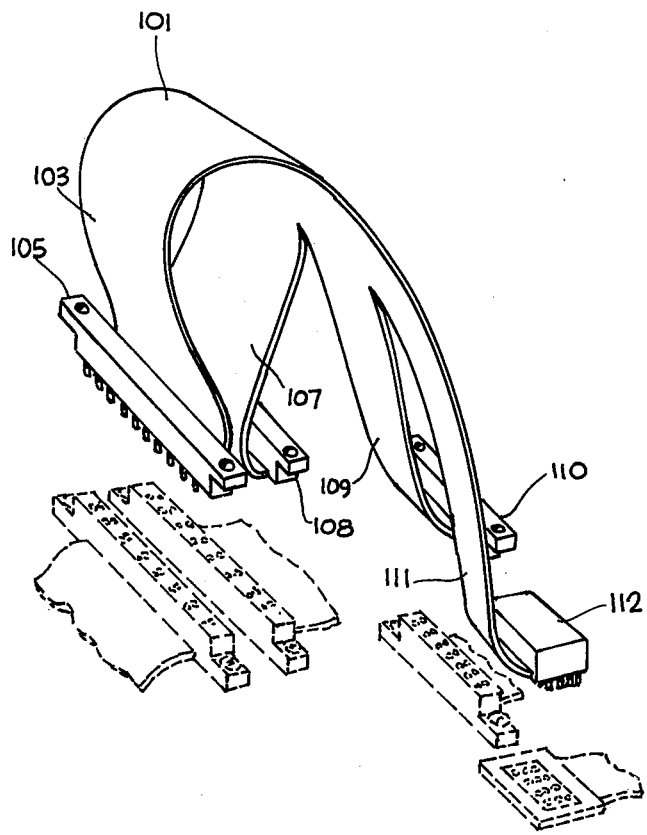
FIG. 6 is a plan view showing use of the apparatus of the present invention with a multi-lead cable having split ends.

FIG. 6 illustrates how a cable, having split ends, may be tested. The cable 101 has a consolidated end 103 which has a large number of conductors, say 50. These are terminated in a connector 105. An unconsolidated end of cable 101 is split into several sections, each going to a different location. For example, section 107 may go to a first location, section 109 may go to a second location, and section 111 may go to a third location, each section carrying signals which are derived from a common location where connector 105 is located. Each of the cable sections 107, 109, 111 is terminated in a respective connector 108, 110, 112. To test cable 101, a connector 105 is connected to a mating connector mounted on the test fixture illustrated in FIG. 3. Connectors 108, 110 and 112, terminating the split ends of cable 101 are respectively connected to mating connectors on the test fixture. All of the mating connectors on the test fixture are connected by means of jumper cables back to the control box as previously explained.

It will be understood in the present application, as well as the accompanying claims that the test which is performed on cables also tests connectors which are attached to ends of the cable. It will be realized that faults which are indicated by the control box may exist in the cable to be tested or the associating connectors. It is assumed that the jumper cables and their associated connectors are in good operating order. If they are not, this will be apparent by the fault showing after a few cables to be tested all show the same fault. If this occurs, either the jumper cables or the test lamps may be defected and should be checked further.

We claim:

1. A cable testing system for testing multi-conductor cables of selected width comprising,
    a test fixture having mechanical stability and having a plurality of tracks therein adapted for mounting cable connectors of selected width and having at least a first pair of sockets mounted in and moveable along said tracks for mating to a test pair of connectors of a multi-conductor cable to be tested, and
    a control box having a multiplicity of test lamps therein, means for energizing said test lamps on command, electrical jumper means connecting said test lamps to said first pair of sockets whereby conductors of a multi-conductor cable to be tested may be energized and tested for continuity through said lamps.

2. The apparatus of claim 1 wherein said first pair of sockets is mounted in said tracks by means of cable connector hardware retainable in said tracks.

3. The apparatus of claim 1 wherein said tracks are parallel and linear.

4. The apparatus of claim 1 wherein said test lamps are divided into two groups corresponding odd and even conductors in a multi-conductor cable and said means for energizing test lamps on command includes a switch for selectively energizing odd and even lamps.

5. The apparatus of claim 1 wherein each of said tracks has a cross-shaped cross-section with transverse and longitudinal dimensions, the transverse dimension accomodating a nut and the longitudinal dimension accomodating a screw passing through the nut.

6. The apparatus of claim 5 wherein said test fixture comprises a plurality of elongated, parallel aligned bars, with each bar having two sides, each of which defines half of a cross-shaped cross-section for said tracks.

7. The apparatus of claim 6 wherein parallel alignment of said bars is maintained by opposed end members rigidly securing each bar in position.

8. The apparatus of claim 7 wherein the cross section of each bar includes screw detents for passage of screws in common with said end members.

9. The apparatus of claim 7 wherein said end members have a trapezoidal shape with a wide base and a narrower apex, said wide base adapted for contact with a flat surface, thereby promoting stability of said test fixture.

10. The apparatus of claim 1 wherein said electrical jumper means includes a second pair of sockets.

11. The apparatus of claim 10 wherein said electrical jumper means further includes a pair of jumper cables connected between said first and second pairs of sockets.

* * * * *